United States Patent [19]

Aguille et al.

[11] Patent Number: 4,727,481
[45] Date of Patent: Feb. 23, 1988

[54] MEMORY ADDRESSING DEVICE

[75] Inventors: Gérard Aguille; Jean-Claude R. Jolivet, both of Paris Cedex, France

[73] Assignee: Societe Anonyme de Telecommunications, Paris, France

[21] Appl. No.: 670,295

[22] Filed: Nov. 13, 1984

[30] Foreign Application Priority Data

Nov. 15, 1983 [FR] France ................. 83 18090

[51] Int. Cl.⁴ ............................ G06F 7/00; G11C 8/00
[52] U.S. Cl. ..................................... 364/200; 365/236; 377/46; 377/54
[58] Field of Search ... 364/200 MS File, 900 MS File; 365/236, 222; 370/80; 358/240; 377/46, 54

[56] References Cited

U.S. PATENT DOCUMENTS

| | | | |
|---|---|---|---|
| 3,749,845 | 7/1983 | Fraser | 370/80 |
| 3,992,699 | 11/1976 | Krumbach | 364/900 |
| 4,016,545 | 4/1977 | Lipovski | 364/900 |
| 4,047,247 | 9/1977 | Stanley et al. | 364/200 |
| 4,115,867 | 9/1978 | Vladimirov et al. | 364/900 |
| 4,202,035 | 5/1980 | Lane | 364/200 |
| 4,393,482 | 7/1983 | Yamada | 365/236 |
| 4,503,525 | 3/1985 | Malik et al. | 365/222 |

Primary Examiner—Gary V. Harkcom
Assistant Examiner—Randy W. LaCasse
Attorney, Agent, or Firm—Laubscher & Laubscher

[57] ABSTRACT

An addressing device for a memory, such as a dynamic memory ROM or RAM, addressable by address words at a predetermined clock-period rate. Each address word is made up of first and second address words composed of least significant and most significant bits of the address word respectively. The first and second address words are multiplexed. The device comprises an adding circuit for incrementing the first address words in terms of a predetermined digital signal carrying words that are synchronous with the first address words and for incrementing the second address word in each address word by unity whenever the first word of the address word has bits all equal to "1", and a shift circuit looped across the adding circuit in order to deliver the first and second multiplexed address words to the memory.

12 Claims, 4 Drawing Figures

MEMORY ADDRESSING DEVICE

BACKGROUND OF THE INVENTION

1. Field of the Invention

The present invention relates to a device for addressing a memory, and in particular a dynamic memory. The device delivers address words each composed of first and second address words containing least significant bits and most significant bits of the address word. Generally speaking, the invention relates to sequential addressing of a memory such as that used in digital videocommunication systems where it is necessary to carry out inter-picture and/or infra-picture processing.

2. Description of the Prior Art

Memories generally offer a capacity of 4, 16, 64 or 256 Kbits, where the integer K is equal to $2^{10}=1024$. Thus, for a 64-Kbit capacity memory, it is necessary to have address words with $6+10=16$ bits in order to address the 1-bit cells of the memory. In order to limit the number of leads in a memory addressing-input bus and hence the number of pins on an integrated circuit package housing the memory, each 16-bit address word is split into two parallel 8-bit words transmitted in series. The first word contains the 8 least significant bits (LSB) of the address word and the second word contains 8 most significant bits (MSB) of the address word.

When the memory is of the alternate read and write addressing type, first and second read address words and first and second write address words are successively transmitted in an 8-lead addressing bus to the memory over one clock period defining an addressing cycle of a memory cell. In practice, the memory cells are arranged in a matrix of rows and columns. Each cell disposed at the intersection of a row and a column is addressed by a first 8-bit word indicating the number of the corresponding cell row and by a second 8-bit word indicating the number of the corresponding cell column.

As depicted schematically in FIG. 1, an addressing device for a 64-Kbit memory 5 comprises a 16-bit write counter 1 and a 16-bit read counter 2 simultaneously delivering a 16-bit write address word and a 16-bit read address word during each clock period respectively. The read and write address words are multiplexed in a 16-lead bus at an output from a multiplexer 3. The multiplexed 16-bit address words are then multiplexed into parallel 8-bit words in a second multiplexer 4 having an 8-lead output bus delivering first and second 8-bit read address words and first and second 8-bit write address words to eight addressing inputs of memory 5.

In integrated circuit technology based on TTL transistors for example, the addressing device shown in FIG. 1 requires four packages for each counter 1, 2, four packages for multiplexer 3 and two packages for multiplexer 4, i.e. fourteen integrated circuit packages in all.

OBJECTS OF THE INVENTION

The main object of the invention is to provide a memory addressing device that is more economical in regard to the number of integrated circuit packages and is therefore cheaper than those in the prior art.

Another object of the invention is to provide a memory addressing device in which address words to be successively delivered to a memory can be repeated or deleted.

SUMMARY OF THE INVENTION

Accordingly, there is provided an addressing device for a memory addressable by means of address words at a predetermined clock-period rate, each address word being made up of first and second address words composed of least significant and most significant bits of the address word respectively, the first and second address words being multiplexed, the device comprising means for incrementing the first address words in terms of a predetermined digital signal carrying words that are synchronous with the first address words and for incrementing the second address word in each address word by unity whenever the first word of the address word has bits all equal to "1", and shift means looped across the incrementing means in order to deliver the first and second multiplexed address words to the memory.

By way of looping the shift means across the incrementing means, the incrementing means fulfil functions analogous to those of the write and read counters in the prior art, by subjecting each address word to an addition operation and more specifically, by subjecting each of the first and second words to an addition operation. Furthermore, the incrementing means consists of a known adding circuit and a few simple electronic components, which reduces the cost and, above all, the dimensional volume of the addressing device.

The first and second words are multiplexed on a continuous basis in the shift means. The shift means can comprise four circuits with P flip-flops where P is equal to the number of bits in the first and second address words for a memory of $2^{2P}$ cells when the memory is preferably alternately read and write addressable.

BRIEF DESCRIPTION OF THE DRAWING

Other advantages and characteristics of the invention will be apparent from the following description of several preferred embodiments of the invention with reference to the corresponding accompanying drawings in which.

DESCRIPTION OF THE PREFERRED EMBODIMENTS

Reference is made hereinafter, by way of an example, to a dynamic memory 5 having a 64-Kbit capacity. Memory 5 contains thus $2^{2P}=2^{16}=65,536$ memory cells each capable of storing a 1-bit word. In other embodiments, each memory cell may store a word having a predetermined bit number, e.g. equal to 8, 16 or 20. Serialized data to be written is fed into an input 50 of memory 5. An output 51 from the memory delivers data bits read in the memory. The cells are addressable by addresses numbered from 0 to $AD=2^{16}-1=65,535$. Each cell address and, where integer ad lies between 0 and AD, is coded into a binary address word having $2P=16$ bits. Each address word is composed of a first word $ad_1$ with P=8 bits including the address word least significant bits (LSB) and a second $ad_2$ with P=8 bits including the address word most significant bits (MSB). The first words $ad_1$ lie between 0 and $2^P-1=255$ and the second words $ad_2$ also lie between 0 and $2^P-1=255$. As a result, an address ad is equal to ad+256 $ad_2$.

When the cells 0 to AD are sequentially addressed, the memory is addressed firstly by address words 0+0 to 255+0, then by 0+256 to 255+256 and so on up to 0+(256×255) to 255+(256×255)=$2^{2P}-1$. Consequently, when an address ad+1 follows an address a, both having ad same second word $ad_2$, the address word ad+1 is deduced from the address word ad by incrementing the first word $ad_1$ of the word ad by unity. When a sequence of address words 0+256$ad_2$ to 255+256$ad_2$ is scanned, the second word $ad_2$ in the sequence is incrementing by unity in order to move onto the following sequence of address words 0+256 ($ad_2$+1) to 255+256 ($ad_2$+1). In this way, to address successively the cells 0 to $2^{2P}-1$ in memory 5, an addition of a unity modulo-256 is performed on the first word $ad_1$ for each sequence of 256 address words and an addition of a unity modulo-256 is performed on the second word $ad_2$ to move on from one sequence of 256 words to the next.

The addressing devices embodying the invention as described hereinafter are based on the above-mentioned operations. In the embodiments described below, circuits related to the memory such as time-base, write and read authorizing circuits and analogous circuits are not depicted.

Figure 1:
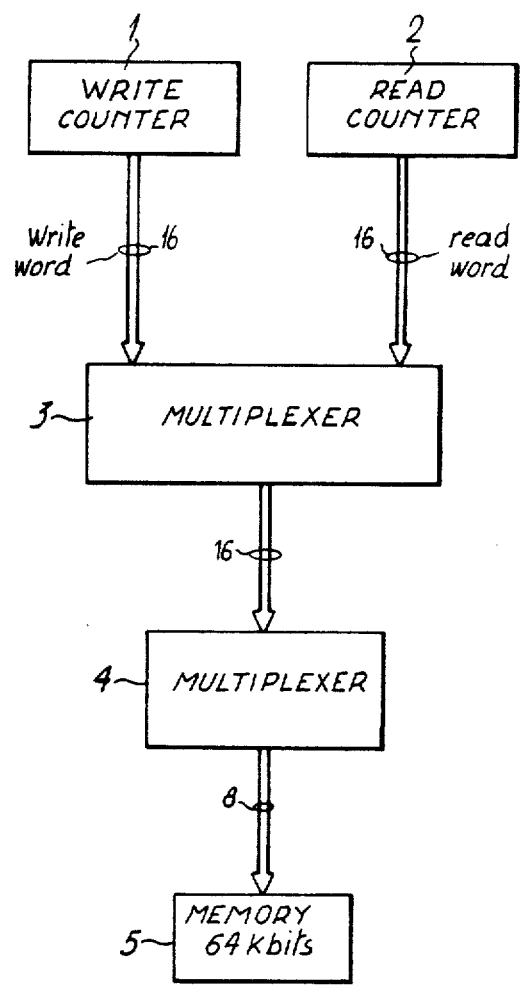
FIG. 1 is a block diagram of a memory addressing device embodying the prior art.
Figure 2:
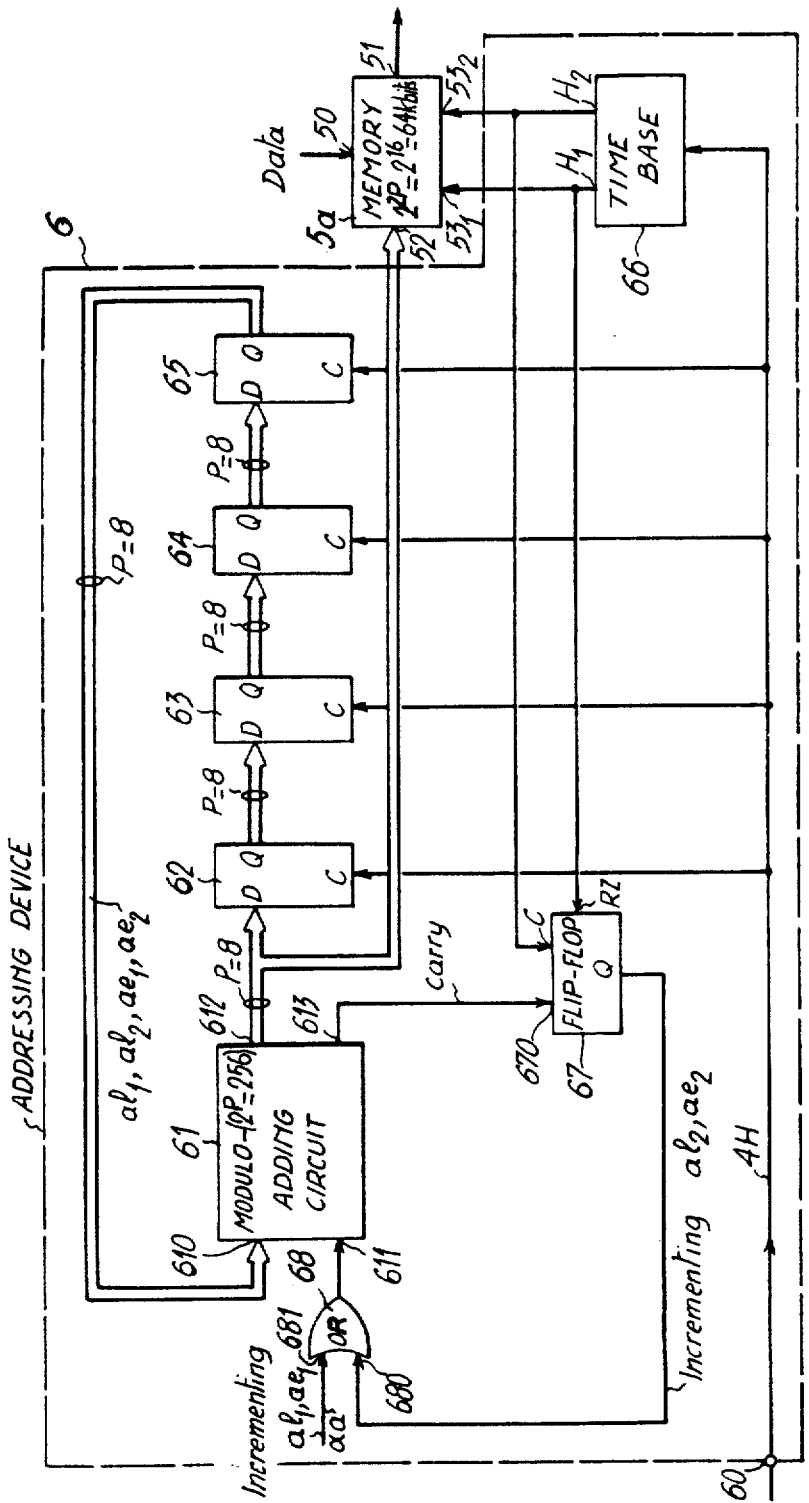
FIG. 2 is a block diagram of an addressing device for a memory with alternate read and write addressing as in a first embodiment invention.

In a first embodiment shown in FIG. 2, a memory 5a is addressable in alternate write and read over one period of a clock signal H by means of an addressing device 6. Hereinafter, H refers also to the frequency of the clock signal H.

Addressing device 6 essentially comprises a modulo-$2^P$ adding circuit 61, where $2^P$=256, having an input bus 610 with P=8 leads and a single input 611, and a shift register comprising four stages 62 to 65 looped across circuit 61. Each stage 62 and 65 is made up of an octuple flip-flop, i.e. eight D-type flip-flops connected in parallel. Inputs D of the eight flip-flops in first octuple flip-flop 62 are connected to P=8 leads of an output bus 612 of addding circuit 61 respectively. Outputs Q of the eight flip-flops in last octuple flip-flop 65 are connected to P=8 leads of input bus 610 of circuit 61 respectively.

Clock inputs C on all flip-flops 62–65 receive a clock signal having a frequency 4H across an input 60 of device 6. As will be seen below, output bus 612 that is connected to P=8-input address bus 52 of memory 5 successively transmits a first read address word $al_1$, a second read address word $al_2$, a first write address word $ae_1$ and a second write address word $ae_2$ respectively over four successive periods of the signal 4H. The words $al_1$ and $al_2$ are both 8-bit words carrying a read address word al, and the words $ae_1$ and $ae_2$ are both 8-bit words carrying a write address word ae.

Addressing device 6 further comprises an auxiliary time base 66, including frequency dividers, a D-type flip-flop 67 and a two-input OR gate 68.

Time base 66 receives the clock signal 4H and delivers two complementary clock signals $H_1$ and $H_2$ having a frequency 2H at inputs $53_1$ and $53_2$ of memory 5. The signal $H_1$ is synchronous with the least significant bit words $al_1$ and $ae_1$ in input bus 52 and the signal $H_2$ is synchronous with the most significant bit words $al_2$ and $ae_2$ in bus 52. The signals $H_1$ and $H_2$ therefore make it possible to differentiate between the least and most significant address bits and thus to address a memory cell in write and read via corresponding rows and columns in memory 5a.

A carry output 613 of circuit 61 is connected to an input 670 of flip-flop 67. A zero resetting input RZ and a clock input C of flip-flop 67 respectively receive the clock signals $H_1$ and $H_2$ from time-base 66. Under these conditions, when a least significant bit word $ae_1$, $al_1$ equal to $2^P-1=255$ and outputting from flip-flop 65 is fed into input bus 610 of the adding circuit, output bus 612 delivers a least significant bit word $al_1$, $ae_1$ equal to zero as a result of the modulo-256 operation in circuit 61, when a "1" is fed to input 611. Simultaneously therewith, carry output 613 feeds a "1" to input 670 of flip-flop 67. Next, in response to clock signal pulse $H_2$ corresponding to the transmission of a most significant bit word $al_2$, $ae_2$ by flip-flop 65, flip-flop 67 feeds a "1" to input 611 of circuit 61 in order to increment by unity the most significant bit word $al_2$, $ae_2$ following the least significant bit word $al_1$, $ae_1$ having bits all equal to "1" and equal to $2^P-1=255$. Flip-flop 67 thus delivers a carry of 1 bit after 256 successive additions relative to read $al_1$ or write $ae_1$ words. As output Q of flip-flop 67 is connected to input 611 of circuit 61 via OR gate 68, a "1" bit is added to the respective word $al_2$, $ae_2$ leaving octuple flip-flop 65 in response to the aforesaid pulse of the signal $H_2$. Flip-flop 67 is reset in response to each signal $H_1$ pulse in order not to interfere with an addition of unity to the words $ae_1$ and $al_1$, as indicated below.

As can be seen in FIG. 2, an input 680 of OR gate 68 is connected to the output Q of flip-flop 67 and another input thereon receives a predetermined digital signal $aa$. The signal $aa$ normally transmits bits that are synchronous with the signal $H_1$ in order to feed a "1" to input 611 of adding circuit 61 when input bus 610 receives a least significant bit word $al_1$, $ae_1$. Between two pulses in signal $H_1$, the signal $aa$ is in state "0" corresponding to the signal $H_2$. The signal $aa$ makes it possible to increment the words $al_1$ and $ae_1$ by unity whenever said words enter circuit 61.

During four successive periods in the clock signal 4H, there is a transfer of each word $al_1$, $al_2$, $ae_1$, $ae_2$ through stages 62, 63, 64 and 65 and adding circuit 61 as well as a reception of these words in input bus 52 of memory 5a, and hence a data word is read and another data word is written in relation to the memory cells carrying addresses $al_1$+256 $al_2$ and $ae_1$+256 $ae_2$. It will be observed that the read and write addresses during a period of signal H can differ. During first and third periods of signal 4H, the least significant bit words $al_1$ and $ae_1$ are delivered by the output bus Q of last octuple flip-flop 65 and are incremented by unity in circuit 61 when the signal $aa$ is in state "1". If the signal $aa$ is in state "0", the corresponding word $al_1$, $ae_1$ is retransmitted by output bus 612 to bus D of flip-flip 62 and input bus 52 of memory 5a thereby making it possible to repeat a reading operation on a same data word transmitted over output 51 or a writing operation on a same data word on input 50 in the same cell of memory 5a. During second and fourth periods of signal 4H, the most significant bit words $al_2$ and $ae_2$ are delivered by the output bus Q of last octuple flip-flop 65 and are incremented by unity in circuit 61 only when the output Q of flip-flop 67 is in state "1", or in other words, only when the respective preceding last significant bit word $al_1$, $ae_1$ leaving octuple flip-flop 65 is equal to 255. Table I below recaps on the incrementations possible during one clock signal H period.

TABLE I

| | H | | | |
|---|---|---|---|---|
| | $H_1$ | $H_2$ | $H_1$ | $H_2$ |
| bus 612-52 | $al_1$ | $al_2$ | $ae_1$ | $ae_2$ |
| aa | "1" or "0" | "0" | "1" or "0" | "0" |
| output Q from flip-flop 67 | "0" | "0" if $al_1 \neq 255$ "1" if $al_1 = 255$ | "0" | "0" if $ae_1 \neq 255$ "1" if $ae_1 = 255$ |

In further embodiments, address bus 52 of memory 5a can be connected to the output bus Q of one of octuple flip-flops 62 to 65 and the clock signals $H_1$ and $H_2$ are modified accordingly.

Figure 3:
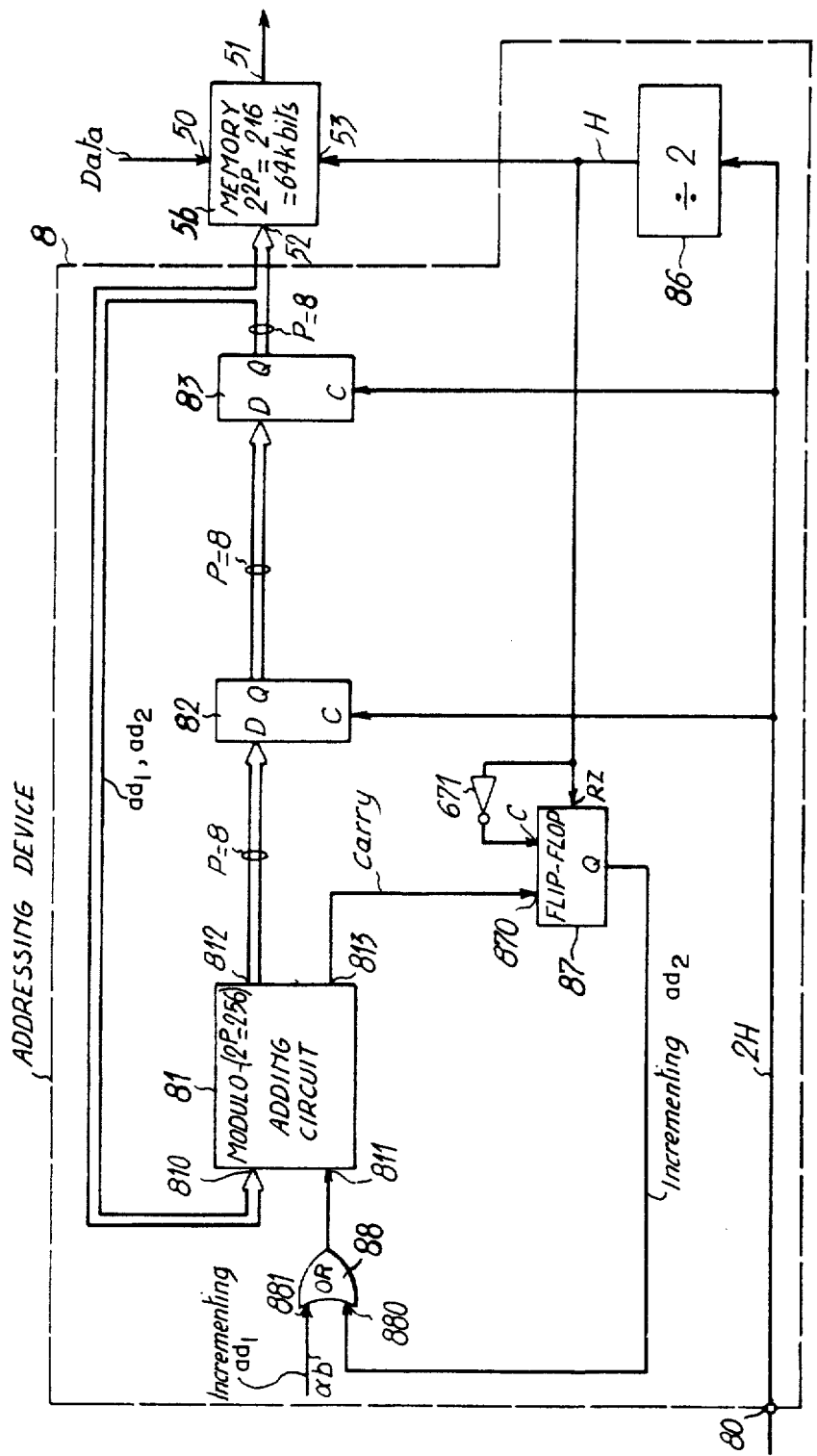
FIG. 3 is a block diagram of an addressing device for a memory with simultaneous read and write addressing as in a second embodiment of the invention.

In an embodiment depicted in FIG. 3, a dynamic memory 5b can be addressed simultaneously in reading and writing by an addressing device 8. Putting this another way, each cell in memory 5b can be addressed in reading and writing by the same address word ad-$= ad_1 + 256 ad_2$ consisting of two 8-bit parallel words $ad_1$ and $ad_2$ fed consecutively to input bus 52 of memory 5b. The read-write frequency is again equal to H. In this case, addressing device 8 comprises two octuple flip-flops 82 and 83 connected in series and a time-base 86 receiving a clock signal 2H via an input 80 on device 8. Time-base 86 consists of a divide-by-2 frequency divider and provides an output feeding a clock signal H to a clock input 53 of memory 5b in order to make a distinction between the least significant bit words $ad_1$ and the most significant bit words $ad_2$.

Device 8 further comprises a modulo-256 adding circuit 81, a flip-flop 87 and a two-input OR gate 88, that are mutually connected like circuits 61, 67 and 68 in device 6. An 8-lead output bus Q of second octuple flip-flop 83 is connected to address bus 52 of memory 5b and an input bus 810 of circuit 81. An 8-lead output bus 812 of adding circuit 81 is connected to an input bus D of first octuple flip-flop 82. A carry output 813 of circuit 81 is connected to an input 870 of flip-flop 87. In other embodiments, bus 812 or an input bus Q of flip-flop 82 is connected to bus 52.

Flip-flop 87 operates like flip-flop 67 and carries a zero-resetting input RZ and a clock input C connected directly and through an inverter 671 to the output of time-base 86 respectively.

On OR gate 88, an input 880 is connected to an output Q of flip-flop 87 in order to increment by unity a word $ad_2$ in circuit 81 whenever the word $ad_1$ entering circuit 81 and preceding the aforesaid word $ad_2$ during the same signal period H is equal to $2^P - 1 = 255$. An input 881 or OR gate 88 receives a signal ab having bits synchronous with the least significant bit words $ad_1$ delivered by the output bus Q of flip-flop 83 in order to increment by unity or to repeat the words $ad_1$.

Addressing device 8 is used for a RAM memory with simultaneous reading and writing, such as a buffer memory of FIFO or LIFO type, and also for a ROM memory, or some analogous memory such as PROM, EPROM, EEPROM, EAROM addressable only in reading.

Addressing device 8 can also be used for simultaneously addressing two random access memories one of which is read and the other written and vice versa. If, for instance, the two memories are buffer memories each capable of storing a picture field in a digital video signal, one of the memories receives the address words $ad_1 ad_2$ in the form of read words in order to read and deliver an odd picture field while the other memory is receiving the address words $ad_1 ad_2$ in the form of write words in order to write and store an even picture field. Reciprocally, during the following field period, the first memory writes and stores a following odd field while the second memory reads and delivers the even field previously stored. In other embodiments, two buffer memories can alternatively store successive pictures instead of picture fields.

However, in television picture digital transmission systems, inter-picture and/or infra-picture processing proves necessary in order to bring down the digital bit rate of the video signal prior to line transmission. By way of an example, for interpicture processing of the conditional replenishment type, the transmission picture memory consists of a random access memory simultaneously addressable in reading and writing such as memory 5b.

In other colour television picture digital transmission systems destined for transmitting a digital video signal in a 34 Mbit/s channel, the picture memory must be write addressed at a speed that is higher than in reading, which amounts then to repeating one or more predetermined read addresses.

Figure 4:
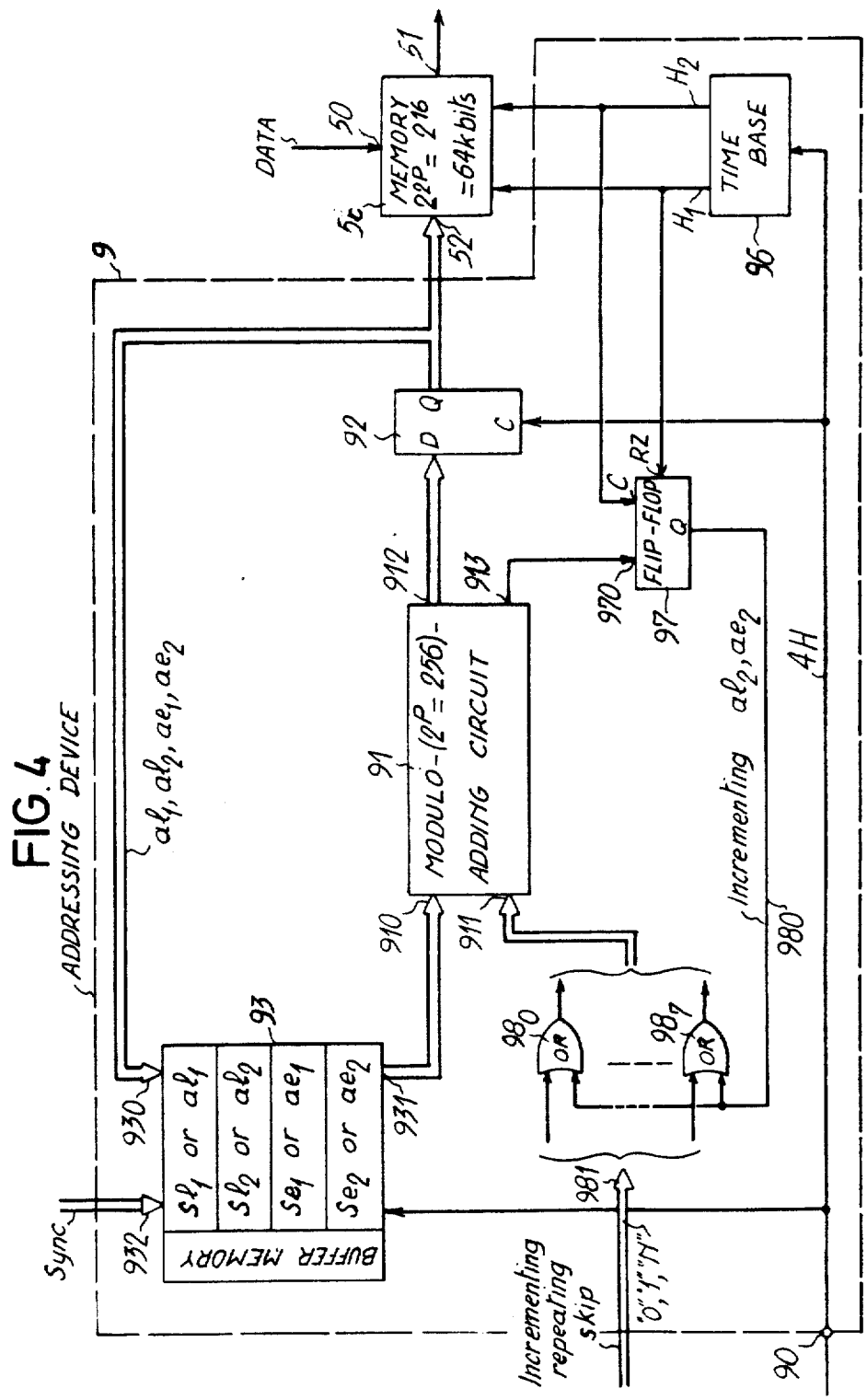
FIG. 4 is a block diagram of an addressing device for a memory with alternate read and write addressing, permitting address skips and synchronization of the memory, as in a third embodiment.

FIG. 4 shows an addressing device 9 that can be adapted for a picture memory 5c of the type hereinabove. In actual fact, addressing device 9 as in a third embodiment can be used for repeating and for deleting one or more predetermined addresses in reading and/or writing.

Addressing device 9 is substantially analogous to device 6. Device 9 comprises a closed loop in which read address words $al_1$, $al_2$ and write address words $ae_1$, $ae_2$ flow. Said loop consists of a modulo-256 adding circuit 91, an octuple flip-flop 92 and a buffer memory 93. An output bus 912 of circuit 91 is connected to an input bus 52 of a data word memory 5c and an input bus 930 of buffer memory 93 via flip-flop 92. Memory 93 is of the FIFO type, for instance, and contains four cells carrying 8 bits each making it possible to write and read the address words $al_1$, $al_2$, $ae_1$ and $ae_2$ successively. An output bus 931 of memory 93 is connected to an 8-lead input bus 910 of circuit 91. As in the case for device 6, an input 90 of device 9 feeds the clock signal 4H to a time base 96 that is identical to time-base 66. Signal 4H is also bed to octuple flip-flop 92 and buffer memory 93. 96 delivers signals $H_1$, and $H_2$ to the memory 50 and a flip-flop 97.

Incrementing means for address words in device 9 can be provided in a fashion analogous to the case of circuits 61, 67 and 68.

Buffer memory 93 further comprises a second 8-lead input bus 932 making it possible to replace one of the words $al_1$, $al_2$, $ae_1$ and $ae_2$ transmitted by flip-flop 92 and written in memory 93 by one of synchronization words $Sl_1$, $Sl_2$, $Se_1$ and $Se_2$ respectively. Such replacement is carried out between a write and a read operation on the word to be replaced, i.e. during at the most a time equal to three periods of signal 4H. The words $Sl_1$ and $Sl_2$ are made up of 8 least significant bits and 8 most significant bits of a read synchronization word Sl permitting read synchronization of the data words, or to be more precise, read synchronization of a picture or a picture field, stored in memory 5c. Words $Se_1$ and $Se_2$ are made up of 8 least significant bits and 8 most significant bits of a write synchronization word Se permitting write synchronization of the data words in memory 5c. After one of the foregoing synchronizations, i.e. once word Sl, Se has been reading or writing in memory 93, the respective read or write operation on memory 5c is continued starting from the memory cell addressed by the respective word Sl, Se.

In the embodiment illustrated in FIG. 4, the incrementing means are substantially modified with respect to those in device 6. Device 9 further comprises flip-flop 97 having an input 970 connected to a carry output 913 of adding circuit 91. However, OR gate 68 is replaced by eight two-input OR gates $98_0$ to $98_7$ having outputs connected to a second 8-lead input bus 911 of circuit 9. First inputs 980 of gates $98_0$ to $98_7$ are connected to output Q of flip-flop 97. Second inputs of gate $98_0$ to $98_7$ are connected to a bus 981 transmitting incrementation words M each composed of a word $M_1$ made up of 8 least significant bits and a word $M_2$ made up of 8 most significant bits. The words $M_1$ and $M_2$ are respectively synchronized with the words $al_1$, $ae_1$ and $al_2$, $ae_2$.

When a word M is equal to 1, a word $al_1$ or $ae_1$ simultaneously applied to first input bus 910 of adding circuit 91 is incremented by unity, as in the case of circuit 61. In this instance, the word M consists of a first word $M_1$ equal to 1 and second word $M_2$ equal to 0. When a word M has bits all equal to 0 and is therefore made up of $M_1$ and $M_2$ words equalling 0, a word al or ae fed over bus 910 is retransmitted such as by output bus 912 of circuit 91. By way of a successive repetition of words M that equal to zero and are synchronous with the read al or write ae address words, it is possible to read or write the memory cell several times.

The incrementation word M can equal an integer N less than or equal to $AD = 2^{16} - 1 = 65,535$. If so, the word M makes it possible to skip N consecutive addresses and thereby move from the preceding address al or ae delivered by memory 93 to the following address $al + N$ or $ae + N$ for the purpose of erasing a part of the information stored in memory 5c.

It will be observed that circuits 61, 67 and 68 in device 6 depicted in FIG. 2 may be replaced by circuits 91, 97 and $98_0$ to $98_7$ as shown in FIG. 4.

Furthermore, memory 93 can be replaced by a memory carrying two 8-bit cells in order to constitute a simultaneous read and write addressing device analogous to device 8 shown in FIG. 3.

What we claim is:

1. A device for sequentially addressing a memory with a stream of address words, the address words being successively delivered to the memory at a predetermined clock-period rate and each address word including first and second address words composed of least significant bits and most significant bits of the address word, respectively, the first and second address words being multiplexed, comprising
    (a) means for deriving a predetermined digital signal carrying words that are synchronous with the first address words;
    (b) means connected with said deriving means for receiving the first and second address words and said predetermined signal words for alternately incrementing the first and second address words into first and second incremented address words, respectively, the first address words being incremented in response to said predetermined signal words, respectively, and each of the second address words being incremented by 1 when the first address word included in the address word comprising the second address word has bits all equal to "1"; and
    (c) shift means looping said incrementing means for receiving first and second incremented address words and delivering them after a predetermined number of clock periods as new first and second address words to be incremented by said incrementing means, said first and second incremented address words successively produced by said incrementing means composing said stream of address words.

2. Apparatus as defined in claim 1, wherein said incrementing means comprises
    (1) means for adding each first address word outgoing from said shift means and said predetermined digital signal word synchronous with the first address word into a first incremented address word entering said shift means;
    (2) means for detecting said first incremented address words carrying bits all equal to "1"; and
    (3) means for adding 1 to a second address word outgoing from said shift means into a second incremented address word inputting said shift means only when the first address word outgoing from said shift means and included in the address word comprising said second outgoing address word is being detected with all the bits equal to "1".

3. Apparatus as defined in claim 2, wherein the first and second address words each have P bits, where P is an integer, and wherein said adding means comprises a modulo-$2^P$ adding circuit having a carry output connected to said detecting means.

4. Apparatus as defined in claim 3, wherein said detecting means comprises a flip-flop carrying an input delivering a "1" bit to a first input of said adding means through an OR gate whenever one of said first address words outgoing from said shift means and having bits all equal to "1" is fed to a second input of said adding means, said OR gate also receiving said predetermined signal.

5. Apparatus as defined in claim 1, wherein said predetermined digital signal carries binary coded words that are positive integers equal to or more than 0 and are synchronous with the first and second address words, respectively, a predetermined signal word equal to 0 being used for inhibiting any addition in said incrementing and repeating an address word means, equal to 1 being used for only adding 1 in said incrementing means so as to provide consecutive address words, and equal to an integer more than 1 being used for skipping consecutive address words.

6. Apparatus as defined in claim 1, wherein an address word is repeated by said incrementing means when a predetermined digital signal word equal to 0 is fed into said incrementing means.

7. Apparatus as defined in claim 1, wherein an address-word skip is made by said incrementing means when a predetermined digital signal word equal to an integer more than 1 is fed into the incrementing means.

8. Apparatus as defined in claim 1, wherein said shift means comprises at least two flip-flop stages that are timed on half of the clock period and are each capable of storing one of the first and second address words.

9. Apparatus as defined in claim 1, wherein said shift means comprises at least four flip-flop stages that are timed on a quarter of the clock period and are each capable of storing one of the first and second address words.

10. Apparatus as defined in claim 1, wherein said shift means comprises means receiving third address words and connected between outputs of said shift means and inputs of said incrementing means for replacing at least one of the address words by a third address word in order to synchronize at least one of the reading and writing operations in the memory from said third address word.

11. Apparatus as defined in claim 1, wherein during each clock period, one address word made up of a first and second word is only delivered by said device to said memory for simultaneously addressing the memory in reading and writing.

12. Apparatus as defined in claim 1, wherein during each clock period, one read address word and one write address word each composed of first and second address words are delivered by said device to the memory for alternating addressing the memory in reading and writing.

* * * * *